United States Patent
Waldroup et al.

(10) Patent No.: US 6,236,863 B1
(45) Date of Patent: May 22, 2001

(54) COMPREHENSIVE TRANSMITTER POWER CONTROL SYSTEM FOR RADIO TELEPHONES

(75) Inventors: Anthony B. Waldroup, Suwanee; Robert L. Lyall, Jr., Loganville; Richard I. Bain, Lilburn, all of GA (US)

(73) Assignee: Oki Telecom, Inc., Suwanee, GA (US)

( * ) Notice: Subject to any disclaimer, the term of this patent is extended or adjusted under 35 U.S.C. 154(b) by 0 days.

(21) Appl. No.: 09/042,759

(22) Filed: Mar. 17, 1998

Related U.S. Application Data

(60) Provisional application No. 60/072,101, filed on Mar. 31, 1997.

(51) Int. Cl.[7] .................................................. H04B 1/38

(52) U.S. Cl. ............................ 455/522; 455/63; 455/126

(58) Field of Search ........................... 455/13.4, 63, 67.3, 455/69, 133, 134, 135, 136, 295, 296, 422, 522, 572, 571, 574, 429, 246.1, 126, 420; 375/205, 254, 278, 284, 285, 346; 370/320, 342

(56) References Cited

U.S. PATENT DOCUMENTS

| | | | |
|---|---|---|---|
| D. 375,937 | 11/1996 | Mergenthaler et al. | D14/110 |
| 2,678,998 | 5/1954 | Young, Jr. | 250/6 |
| 2,924,703 | 2/1960 | Sichak et al. | 250/6 |
| 3,624,561 | 11/1971 | Tongue | 333/6 |
| 4,261,054 | 4/1981 | Scharla-Nielsen | 455/12 |
| 4,263,560 | 4/1981 | Ricker | 330/129 |
| 4,307,455 | 12/1981 | Juhasz et al. | 364/900 |
| 4,406,019 | 9/1983 | Ide et al. | 455/245 |
| 4,510,460 | 4/1985 | Tamura | 330/285 |
| 4,523,155 | 6/1985 | Walczak et al. | 330/279 |

(List continued on next page.)

FOREIGN PATENT DOCUMENTS

| | | |
|---|---|---|
| 60-103743 | 6/1985 | (JP). |
| 2-55428 | 2/1990 | (JP). |
| 3297227 | 12/1991 | (JP). |

(List continued on next page.)

OTHER PUBLICATIONS

CDMA Digital Cellular An ASIC Overview; Richard Kerr; Applied Microwave & Wireless; pp. 30–41.

(List continued on next page.)

*Primary Examiner*—Edward F. Urban
*Assistant Examiner*—Congvan Tran
(74) *Attorney, Agent, or Firm*—Thomas, Kayden, Horstemeyer & Risley LLP

(57) ABSTRACT

An output power control system prevents saturation by limiting total output power and maintaining closed loop responsiveness for a radio telephone having closed loop and open loop gain control systems. The output power control system determines when total output power exceeds an output power trigger level and automatically enters a saturation prevention mode whereby total output power is reduced through modification of a closed loop power control register. In one embodiment, an output detector and an output comparator continuously monitor output power, and in another embodiment, an analog-to-digital converter samples output power levels. Saturation prevention processes of various preferred embodiments include, through continual monitoring, edge-triggered interrupt servicing, and level-triggered interrupt servicing, subsequently modifying the closed loop power control register to decrease the closed loop output power control portion of the total output power until the output power falls below the output trigger level. A saturation prevention method of yet another embodiment includes maintaining the closed loop power control register at a constant level unless a decrease in received signal strength is detected, in which case the closed loop power control register is modified to compensate for an increased open loop component of the total output power.

17 Claims, 9 Drawing Sheets

U.S. PATENT DOCUMENTS

| | | | |
|---|---|---|---|
| 4,553,105 | 11/1985 | Sasaki | 330/145 |
| 4,560,949 | 12/1985 | Young | 330/284 |
| 4,602,218 | 7/1986 | Vilmur et al. | 330/279 |
| 4,633,316 | 12/1986 | Burke et al. | 358/197 |
| 4,636,741 | 1/1987 | Mitzlaff | 330/127 |
| 4,709,403 * | 11/1987 | Kikuchi | 455/126 |
| 4,718,116 | 1/1988 | Jacobs et al. | 455/245 |
| 4,742,565 | 5/1988 | Iwahashi | 455/234 |
| 4,811,421 | 3/1989 | Havel et al. | 455/69 |
| 4,817,192 | 3/1989 | Phillips et al. | 455/75 |
| 4,817,197 | 3/1989 | Shimizu et al. | 455/208 |
| 4,870,698 | 9/1989 | Katsuyama et al. | 455/67 |
| 4,893,349 | 1/1990 | Eastmond et al. | 455/205 |
| 4,958,359 | 9/1990 | Kato | 375/1 |
| 5,020,092 | 5/1991 | Phillips et al. | 379/59 |
| 5,020,093 | 5/1991 | Pireh | 379/59 |
| 5,056,109 | 10/1991 | Gilhousen et al. | 375/1 |
| 5,093,840 | 3/1992 | Schilling | 375/1 |
| 5,099,204 | 3/1992 | Wheatley, III | 330/279 |
| 5,099,493 | 3/1992 | Zeger et al. | 375/1 |
| 5,103,459 | 4/1992 | Gilhousen et al. | 375/1 |
| 5,107,225 | 4/1992 | Wheatley, III et al. | 330/279 |
| 5,107,487 | 4/1992 | Vilmur et al. | 370/18 |
| 5,129,098 | 7/1992 | McGirr et al. | 455/69 |
| 5,144,258 | 9/1992 | Nakanishi et al. | 330/129 |
| 5,170,392 | 12/1992 | Riordan | 370/17 |
| 5,187,809 | 2/1993 | Rich et al. | 455/33.1 |
| 5,228,054 | 7/1993 | Rueth et al. | 375/1 |
| 5,241,690 | 8/1993 | Larsson et al. | 455/54.1 |
| 5,257,283 | 10/1993 | Gilhousen et al. | 375/1 |
| 5,265,119 | 11/1993 | Gilhousen et al. | 375/1 |
| 5,267,262 | 11/1993 | Wheatley, III | 375/1 |
| 5,278,521 | 1/1994 | Sato | 331/14 |
| 5,278,992 | 1/1994 | Su et al. | 455/69 |
| 5,280,643 | 1/1994 | Ishii | 455/254 |
| 5,283,536 | 2/1994 | Wheatley, III et al. | 330/279 |
| 5,323,425 | 6/1994 | Colamonico et al. | 375/98 |
| 5,345,598 | 9/1994 | Dent | 455/54.1 |
| 5,369,792 * | 11/1994 | Matsumoto et al. | 455/246.1 |
| 5,383,219 | 1/1995 | Wheatley, III et al. | 375/1 |
| 5,386,588 * | 1/1995 | Yasuda | 455/423 |
| 5,392,287 | 2/1995 | Tiedemann, Jr. et al. | 370/95.1 |
| 5,396,516 | 3/1995 | Padovani et al. | 375/225 |
| 5,438,683 | 8/1995 | Durtler et al. | 455/74 |
| 5,442,322 | 8/1995 | Kornfeld et al. | 330/285 |
| 5,452,473 | 9/1995 | Wieland et al. | 455/88 |
| 5,461,639 | 10/1995 | Wheatley, III et al. | 375/205 |
| 5,465,408 | 11/1995 | Sugayama et al. | 455/249.1 |
| 5,467,055 | 11/1995 | Wray et al. | 330/129 |
| 5,469,115 | 11/1995 | Peterzell et al. | 330/129 |
| 5,485,486 | 1/1996 | Gilhousen et al. | 375/205 |
| 5,507,017 * | 4/1996 | Whitmarsh et al. | 455/126 |
| 5,524,287 | 6/1996 | Yokoya et al. | 455/126 |
| 5,528,593 | 6/1996 | English et al. | 370/84 |
| 5,542,111 | 7/1996 | Ivanov et al. | 455/126 |
| 5,564,092 * | 10/1996 | Grandfield et al. | 455/232.1 |
| 5,566,357 | 10/1996 | Holcman | 455/54.1 |
| 5,574,993 * | 11/1996 | Kobayashi et al. | 455/126 |
| 5,577,022 | 11/1996 | Padovani et al. | 370/13 |
| 5,590,408 | 12/1996 | Weiland et al. | 455/69 |
| 5,590,409 * | 12/1996 | Sawahashi et al. | 455/69 |
| 5,603,096 | 2/1997 | Gilhousen et al. | 455/69 |
| 5,604,730 | 2/1997 | Tiedemann, Jr. | 370/252 |
| 5,655,220 | 8/1997 | Weiland et al. | 455/69 |
| 5,669,066 * | 9/1997 | Borg et al. | 455/69 |
| 5,689,815 | 11/1997 | Yamazaki et al. | 455/69 |
| 5,697,081 | 12/1997 | Lyall, Jr. et al. | 455/249.1 |
| 5,758,271 * | 5/1998 | Rich et al. | 455/234.1 |
| 5,978,362 * | 11/1999 | Lee et al. | 370/315 |
| 6,026,288 * | 2/2000 | Bronner | 455/343 |

FOREIGN PATENT DOCUMENTS

| | | |
|---|---|---|
| WO 91/07037 | 5/1991 | (WO) . |
| WO 92/21196 | 11/1992 | (WO) . |
| WO 93/07702 | 4/1993 | (WO) . |
| WO 95/23460 | 8/1995 | (WO) . |
| WO 97/24800 | 7/1997 | (WO) . |
| WO 97/34439 | 9/1997 | (WO) . |

OTHER PUBLICATIONS

Mobile Station—Base Station Compatibility Std. For Dual–Mode Wideband Spread Spectrum Cellular System TIA/EIA Interim Standard IS–95 Jul. 1993.

Schilling et al., Electronic Circuits Discrete & Integrated, 1989, pp. 2–6.

* cited by examiner

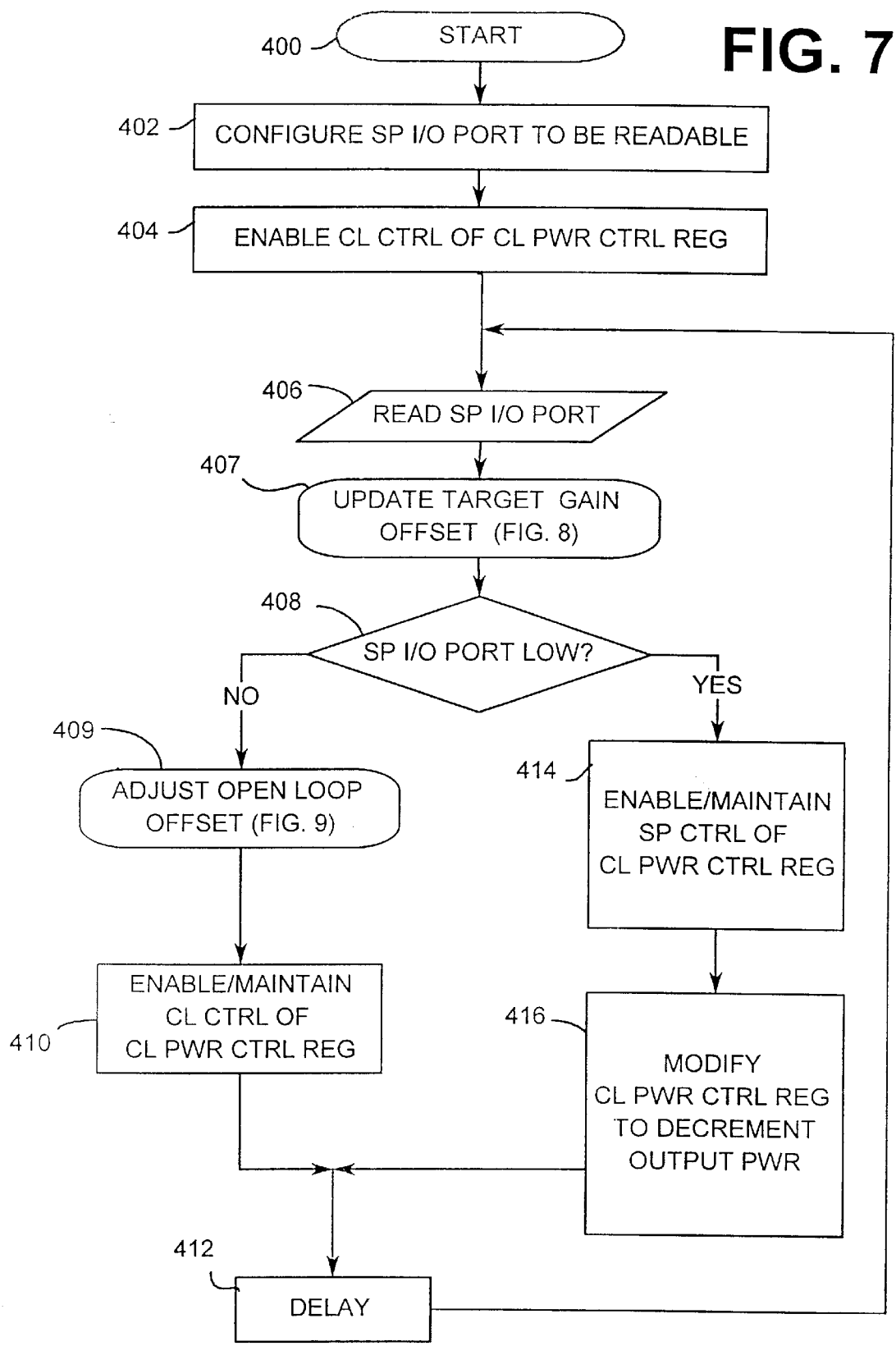

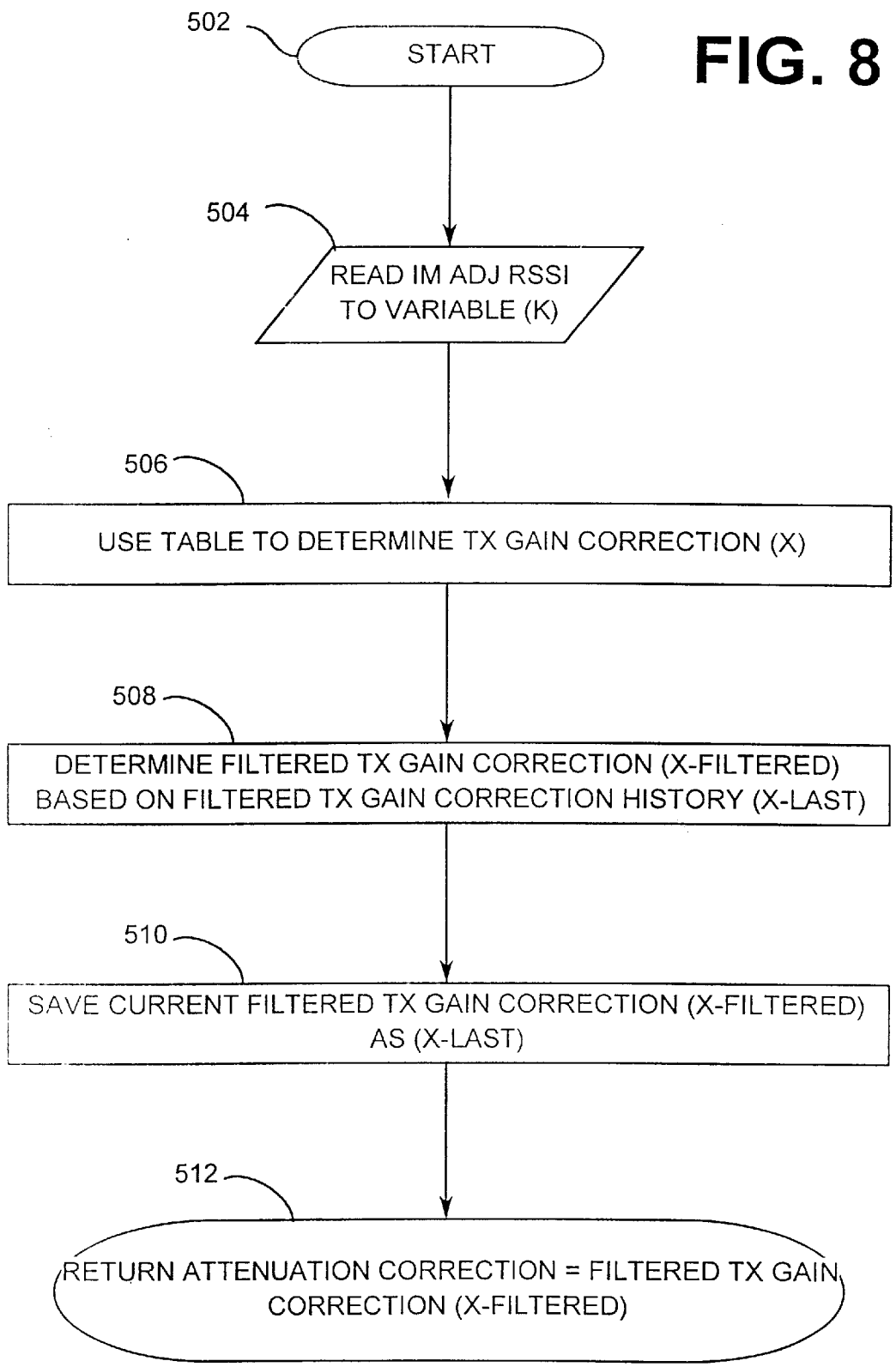

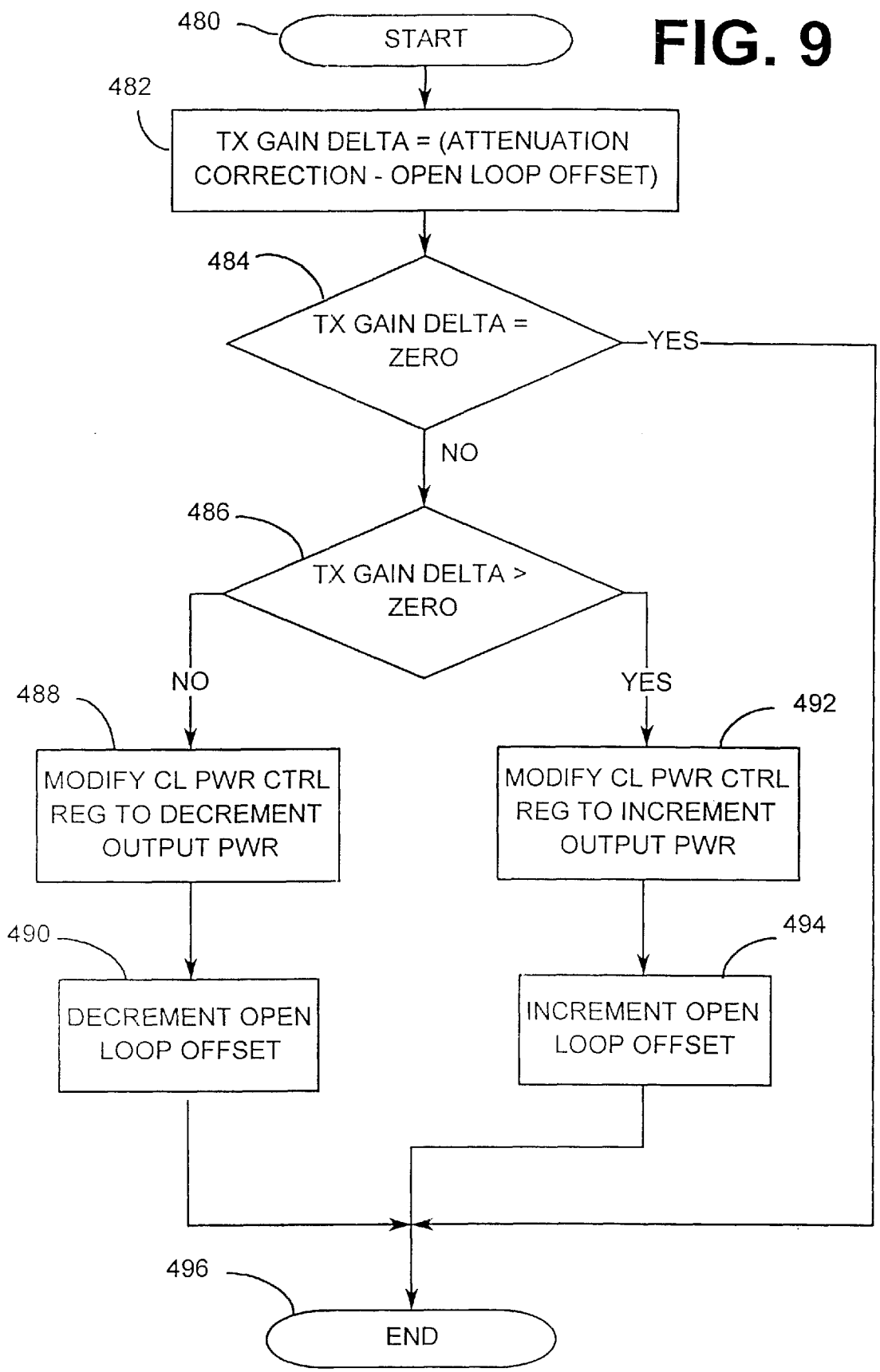

COMPREHENSIVE TRANSMITTER POWER CONTROL SYSTEM FOR RADIO TELEPHONES

CROSS-REFERENCE TO RELATED APPLICATION

This application claims the priority benefit of U.S. Provisional Application Ser. No. 60/072,101, which was converted from U.S. patent application Ser. No. 08/828,881, filed Mar. 31, 1997.

BACKGROUND OF THE INVENTION

The present invention relates generally to the field of radio communication, and more specifically, to the field of output power control in code division multiple access (CDMA) wireless telephones incorporating intermodulation (IM) spurious response attenuation.

Several industry standard publications currently direct design and operation of many types of CDMA cellular telephones, including portable mobile stations, handheld mobile stations, and mobile stations mounted in automobiles. These standards are considered to be understood by those reasonably skilled in the art of the present invention. Standard specifications relevant to the present invention include TIA/EIA/IS-95-A Mobile Station-Base Station Compatibility Standard for Dual-Mode Wideband Spread Spectrum Cellular System, sections 6.1.1.1–6.1.2.4.2, and TIA/EIA/IS-98, Recommended Minimum Performance Standards for Dual-Mode Wideband Spread Spectrum Cellular Mobile Stations, sections 1.4, 9.4.3, 10.4.4.1–10.5.2.3.

Precise mobile station power control is a very important requirement for proper and efficient operation of a CDMA wireless telephone system. During times when a mobile station is located far away from the nearest base station, the mobile station needs to transmit signals at maximum output power to maintain an optimum communication link. However, as a CDMA mobile station moves closer to a base station, the amount of mobile station output power necessary to continue communication is reduced. Furthermore, such a reduction in mobile station output power is necessary to reduce interference between mobile stations. Thus, in addition to preserving battery reserves, the use of as little mobile station output power as is necessary to maintain a strong communication link at all times is a requirement to ensure proper operation of a CDMA cellular telephone system.

According to the above-referenced standards, a CDMA mobile station shall provide two independent means for output power adjustment: open loop estimation, solely a mobile station operation, and closed loop correction, involving both the mobile station and the base station. An open loop gain control system detects the strength of the signal received from the base station and uses that value to inversely control the output power of the mobile station. Thus, according to the open loop gain control system, as the received signal strength increases (the mobile station nearing the base station), the amount of output power is decreased. A typical open loop gain control system includes a conventional automatic gain control system which detects received signal strength and uses that value to control an adjustable gain transmitter amplifier which accordingly varies the amount of gain applied to the radio transmission signal. Thus, the open loop gain control system is solely a mobile station operation based upon the strength of the signal received at the mobile station from the base station.

A closed loop gain control system, on the other hand, involves both the mobile station and the base station. In a closed loop gain control system, the base station detects the strength of the signal received from the mobile station and then accordingly instructs the mobile station to increase or decrease power. Thus, the mobile station continually analyzes control data from the base station (typically in the form of a single bit commanding either an increase or a decrease in power) to determine whether to increase or decrease output power. A closed loop gain control system is typically implemented using a closed loop power control register which is functionally connected to a pulse density modulator within a mobile station modem application-specific integrated circuit (MSM ASIC) to provide an analog output representation of the value stored in the register. This analog representation is then combined with output from the open loop gain control system to assist in controlling the adjustable transmitter amplifier. The register value and adjustable transmitter amplifier are also usually in an inverse relationship such that an increase in the register value (typically due to receiving a "1" from the base station) results in a decrease in overall power.

Another factor that affects mobile station output power control is IM spurious response attenuation of received RF signals by the mobile station. IM signals are extraneous signals produced when two or more interfering analog signals combine and are, for example, mixed in a non-linear medium, such as the non-linear operating region of a semiconductor device such as an amplifier. These interfering analog signals often result in the production of IM signals that fall into the frequency range of the desired digital signal frequency spectrum, the effects of which are to increase the communication errors at the mobile station, potentially causing calls to be dropped. Since the output power of the mobile station is a function of the strength of the signals received from the base station, the attenuation of those signals by the mobile station to reduce IM interference must be accounted for in determining the mobile station output power. For instance, when base station signals are attenuated at the mobile station, the open loop gain control system of the mobile station now detects attenuated signal strengths that do not reflect the actual base station signal strength thereby misleading the mobile station to increase output power. Thus, the attenuation of base station signals by the mobile station must be accounted for by the mobile station output power control system to ensure proper mobile station output power control.

Achieving proper operation of an output power control system incorporating gain control systems which account for received signal attenuation within a single mobile station can create special design challenges. In addition to the difficulties already described, other difficulties are encountered when combining open and closed loop systems by additional requirements imposed by the above-referenced standards. Namely, there are limits on total power output and spurious emission levels, requirements for closed loop variations about the open loop estimate, and response time requirements for responding to instructions from the base station. First, using a handheld mobile station operating at full rate communication, the effective radiated power at maximum output power has an upper limit of 30 dBm and a lower limit of 25 dBm. Thus, when at maximum power, the mobile station must radiate at least 25 dBm but not more than 30 dBm. The actual value for effective radiated power at maximum output power is typically around 28 dBm because of the second requirement which limits maximum spurious emission levels. On the lower end of the total output power scale, the mobile station must have a mean controlled output power less than −50 dBm when the output power is set to minimum. Thus, according to industry standard specifications, the mobile station should ideally be able to output power throughout a range of −50 dBm to 30 dBm.

In addition to these requirements, the closed loop gain control system must have a range of at least 24 dB above and 24 dB below the open loop estimate. In other words, regardless of where the open loop estimate places the total output power along the −50 dBm to 30 dBm range, the closed loop gain control system is required to be able to increase or decrease the total output power by at least 24 dB upward or downward from that open loop estimate. In one implementation of the closed loop gain control system, the closed loop range is divided into equal steps represented by incremental memory values corresponding to one dB units of gain. Thus, as the base station instructs the mobile station to increase or decrease power, the closed loop gain control system attempts to increase or decrease, respectively, the total output power by one dB.

Clearly, these requirements related to total output power and closed loop gain control create the potential for conflict. In other words, if the open loop estimate is within 24 dB of the maximum output power (e.g., above 6 dBm in an ideal 30 dBm system), the potential exists for the closed loop system to enter into a saturated condition. For instance, if the mobile station is far from the base station, the base station may continue to instruct the mobile station to increase power even after the mobile station has reached its maximum output power. In such a situation, the closed loop system could be at least 24 steps above the maximum output ability of the mobile station so that it would take 24 consecutive decrease power instructions from the base station before the mobile station would begin to reduce actual output power. Unfortunately, this result is not acceptable in light of yet another requirement imposed by the above-referenced standard which dictates closed loop responsiveness. According to the responsiveness requirement, after a mobile station receives a reduce power instruction from the base station, the mobile station must begin reducing power within a short defined amount of time. When communicating at full rate, this amount of time is 2.5 ms. Since, at full rate, power control instructions arrive from the base station every 1.25 ms, total output power is required to begin decreasing by the time two subsequent valid power control instructions are received by the base station. Since, as discussed above, it may take 24 or more steps to pull the closed loop gain control system out of saturation, conventional power control systems may be unable to satisfy the closed loop responsiveness requirement. This problem is even more pronounced when the received signals are being attenuated by the mobile station to reduce IM interference which means that the open loop estimate of the required output power is misleading if not adjusted to reflect attenuation of the received signal.

Developing an efficient and reliable solution to this problem which works in all situations and accounts for all factors affecting output power control yet doesn't prevent the resulting system from satisfying the other requirements is not an obvious process. There is, therefore, a need in the industry for a method and an apparatus for addressing these and other related, and unrelated, problems.

SUMMARY OF THE INVENTION

Briefly described, the present invention includes a method and an apparatus for maintaining proper transmit output power control within a radio telephone including a variable attenuator circuit providing variable attenuation to reduce IM interference.

According to a first preferred embodiment, the invention apparatus includes an output detector and an output comparator coupled between a logic circuit (a mobile station modem (MSM) ASIC) and a directional coupler positioned after a radio frequency (RF) power amplifier in the transmission signal line. The output detector generates a direct current (DC) representation of the total output power of the radio telephone which is continuously compared to a constant DC value by an operational amplifier in the output comparator to determine if the total output power has exceeded an output power trigger level to reach a maximum output power level. The results of this continuous comparison are input into the logic circuit through a readable input/output (I/O) port which is continually examined by the logic circuit (a specially-programmed central processing unit (CPU)) every 1.25 ms.

The logic circuit also reads received RF signal attenuation information from a variable attenuator circuit connected at an input section of a receiver section of the cellular telephone in order to appropriately adjust. The attenuation information is converted into digital form by an analog to digital (A/D) converter connected between the variable attenuator circuit and the logic circuit. The variable attenuator circuit decreases IM distortion by variably attenuating received radio frequency (RF) signals before an initial RF amplification stage (thereby preceding subsequent stages as well) to reduce the level of undesirable non-linear products. The variable attenuator circuit is turned on (activated) to gradually begin attenuating and off (deactivated) at a single input power level (no hysteresis) in response to a received signal strength indicator (RSSI) output by an automatic gain control (AGC) circuit.

Further in accordance with the first preferred embodiment of the present invention, while the total output power of the radio telephone is below the output power trigger level the total output power is determined according to a first mode. This first mode includes a combination of an open loop gain control system and a closed loop gain control system using a pulse density modulated output from a closed loop power control register located in the logic circuit. While in the first mode, the closed loop power control register is conventionally controlled both by closed loop power control information received from the base station and according to attenuation information from the variable attenuator circuit. The logic circuit determines a gain correction value corresponding to the level of attenuation of the received RF signals and adjusts the closed loop power control register accordingly. In the preferred embodiment of the present invention, the digital signal representing the current attenuation level is periodically compared, by the logic circuit, against a table of predefined values to return the correct gain correction value. From the gain correction value the closed loop power control register is adjusted by one decibel up or down to reflect current attenuation levels of the received RF signals. Thus, the closed loop power control register is continually adjusted so that the total output power reflects attenuation of the received RF signals by the attenuator circuit as well as conventional base station power control information.

When the total output power rises above the output power trigger level, the logic detects the occurrence through the logic circuit I/O port and begins operation according to a second (saturation prevention) mode and first mode operation is temporarily shut down. One preferred method of controlling the closed loop power control register during the second (saturation prevention) mode of operation includes modifying the closed loop power control register to decrement the total output power until the total output power falls below the output power trigger level. Thus, as long as the output comparator indicates through the logic circuit I/O port that the total output power has reached a maximum level by exceeding the output power trigger level, the logic circuit will continue to decrement the closed loop power control register. (Since the open loop component of the total output varies, the term "maximum power", etc., should be understood to be one of a very small range of output power levels above the output power trigger level.) In this way, the logic circuit disregards any closed loop power control information received from the base station or attenuation information received from the attenuator circuit by both decrementing the closed loop power control register without evaluating the attenuation and closed loop control information as well as disabling the effect of such information. Furthermore, changes in the open loop gain control system are also taken into immediate consideration since the total output power is being continuously detected and continually examined by the logic circuit to provide a consistent and reliable solution. As the total output power falls below the output power trigger level, the power control system of the present invention returns to control of the closed loop power control register according to the first mode. Subsequently, the power control system of the first preferred embodiment of the present invention continues to alternate between the first and second modes in response to the total output power reaching an falling below the maximum output level.

In accordance with this first preferred embodiment of the present invention, variable attenuation is accomplished by use of a circuit including an element with variable impedance. In the particular implementation disclosed herein, the variable impedance element is a PIN diode. The PIN diode is connected to the RF receiver signal line through a small AC-coupling resonating capacitor and acts as variable shunt impedance to ground for the received signals. The PIN diode's impedance level (and thus its level of attenuation) is determined by support circuitry which controls operating current levels in the PIN diode. Thus, by basing the current level through a variable impedance element (such as the PIN diode) on the RSSI, the level of attenuation of the received signal correspondingly varies continuously throughout a range of received signal power levels. In addition, due, at least in part, to the shunt connection of the PIN diode in this first embodiment, attenuation of the RF signals so changes in a non-linear manner that a larger change in attenuation per unit change in input signal strength is provided while the input signal strength is lower.

Now, regarding additional specifics of the disclosed implementation of the first preferred embodiment of the present invention, an attenuator enable signal is supplied from a logic circuit of the mobile station to enable operation of the variable attenuator circuit throughout operation in the CDMA mode. In one preferred embodiment, the logic circuit includes a central processing unit (CPU). However, this logic circuit function can be performed by other devices and combinations of devices (e.g., mobile station modem (MSM) application specific integrated circuitry) which would be obvious to persons skilled in the art and are included within the scope of the present invention. Thus, as soon as the input signal power level rises above a defined activation threshold amount while the variable attenuator circuit is enabled, the variable attenuator circuit is activated and begins attenuating the input signal in the non-linearly changing manner discussed above.

It is, therefore, an object of the present invention to provide a method and an apparatus for maintaining responsiveness of a closed loop gain control system within a radio telephone.

Another object of the present invention is to provide a saturation prevention method and apparatus for a radio telephone with variable attenuation of received RF signals and open and closed loop gain control systems.

Yet another object of the present invention is to provide a radio telephone output power control system which begins decreasing output power within a specified time after receiving a decrease power instruction from a base station.

Yet another object of the present invention is to provide a radio telephone output power control system which modifies a closed loop power control register to prevent response time saturation and limit output power.

Yet another object of the present invention is to provide an RF output detector and an RF output comparator continuously indicating when the RF output power exceeds an output power trigger level.

Still another object of the present invention is to provide a saturation prevention system which includes an operational amplifier output comparator as a basis for overriding conventional closed loop gain control system modification of a closed loop power control register.

Still another object of the present invention is to provide a saturation prevention system which includes an output detector and an analog-to-digital converter as a basis for overriding conventional closed loop gain control system modification of a closed loop power control register.

Still another object of the present invention is to provide a saturation prevention system which automatically reduces output power upon detecting a threshold excessive condition.

Still another object of the present invention is to provide a saturation prevention system for limiting output power of a radio telephone to comply with absolute power and spurious emissions requirements.

Still another object of the present invention is to provide a saturation prevention system which evaluates received signal strength in modifying a closed loop power control register.

Still another object of the present invention is to provide a saturation prevention system which initiates a saturation prevention process when output power exceeds an output power trigger level, wherein the saturation prevention process includes gradually decrementing the total output power through modification of a digital memory element.

Still another object of the present invention is to provide a saturation prevention system which initiates a saturation prevention process when output power exceeds an output power trigger level, wherein the saturation prevention process includes ignoring closed loop power control information received from the base station.

Still another object of the present invention is to provide a saturation prevention system initiates a saturation prevention process when output power exceeds an output power trigger level, wherein the saturation prevention process includes maintaining a closed loop power control register at a constant value unless received signal strength drops, otherwise compensating for the increased open loop component.

Other objects, features and advantages of the present invention will become apparent upon reading and understanding the present specification, when taken in conjunction with the accompanying drawings.

BRIEF DESCRIPTION OF THE DRAWINGS

FIG. 7 is a flow chart representation of a power control process for the elements shown in FIG. 1, in accordance with one preferred embodiment of the present invention.

FIG. 8 is a flow chart representation of a function of the power control process of FIG. 7.

FIG. 9 is a flow chart representation of another function of the power control process of FIG. 7.

DETAILED DESCRIPTION OF THE PREFERRED EMBODIMENTS

Figure 1:
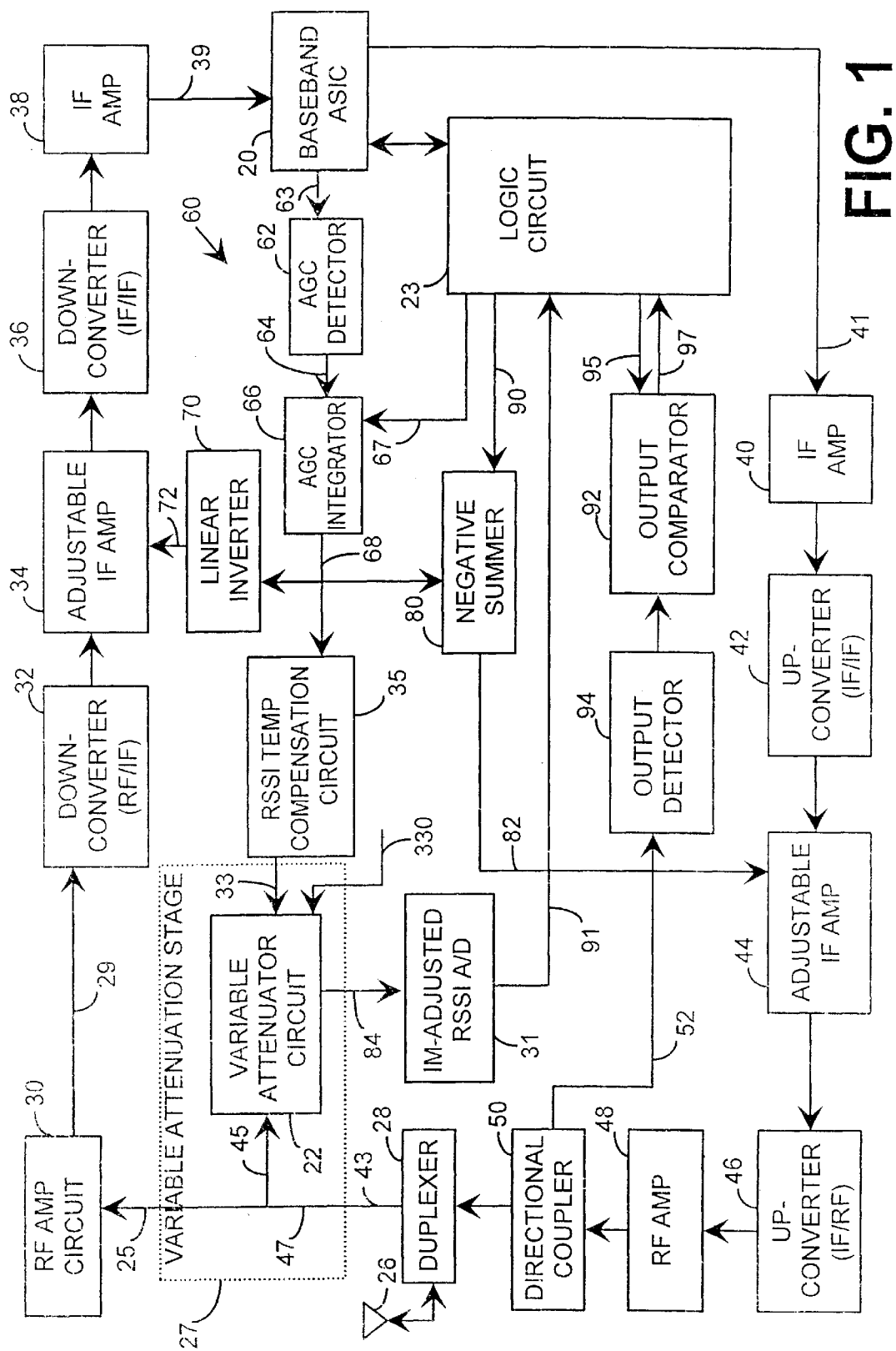
FIG. 1 is a block diagram representation of portions of a radio telephone in accordance with a first preferred embodiment of the present invention.

Referring now in greater detail to the drawings in which like numerals represent like components throughout the several views, FIG. 1 shows a block diagram representation of portions of a code division multiple access (CDMA) spread spectrum cellular radio telephone in accordance with a first preferred embodiment of the present invention. Selected receiver and transmitter circuital elements are connected to a baseband application-specific integrated circuit (ASIC) 20, and a logic circuit 23. In accordance with the first preferred embodiment of the present invention, the baseband ASIC 20 includes customary means for providing low frequency analog processing and conversion of signals to and from the digital domain for interfacing with the logic circuit 23. In particular, functions of the baseband ASIC 20 include intermediate frequency (IF) to baseband conversion (and vice-versa), baseband and IF filtering, baseband signal quadrature splitting and combining, baseband analog to digital and digital to analog conversion, baseband direct current (DC) offset control, local oscillator quadrature generation, and clock amplitude adjustments. Further in accordance with the first preferred embodiment of the present invention, the logic circuit 23 conventionally provides the majority of physical layer signaling through a demodulating unit, a decoding unit, and an interleaving/deinterleaving unit. Among other functional elements, the demodulating unit includes multiple path and searching receivers along with a signal combiner; the decoding unit includes a viterbi decoder and data quality verification means; and the interleaving/deinterleaving unit includes a convolutional encoder, an interleaver, a deinterleaver, a psuedo-random number (PN) sequence spreader, a data burst randomizer, and a finite impulse response (FIR) filter. The logic circuit 23 also includes customary memory and support circuitry such as a conventional static CMOS (complementary-symmetry metal-oxide-semiconductor) high-integration microprocessor with general registers, segment registers, base registers, index registers, status registers, and control registers. In this preferred embodiment, the logic circuit 23 is a combination mobile station modem (MSM) application specific hardware (ASIC) and central processing unit (CPU).

The following describes examples of acceptable elements in accordance with the first preferred embodiment of the present invention. Except for the internal configuration modifications discussed herein (programming, etc.) prior art examples of an acceptable CPU, MSM ASIC, (which make up the logic circuit 23) and baseband ASIC 20 are, respectively, the 80C186 microprocessor available from Advanced Micro Devices of Sunnyvale, Calif., the Q53101-1S2 baseband ASIC available from Qualcomm, Inc. of San Diego, Calif., and the Q501-1S2 MSM also available from Qualcomm, Inc. Furthermore, it should be understood that the portions of the radio telephone shown in FIG. 1 are only selected parts of the total cellular telephone which includes a host of other components which, although not shown in any FIGS., would be readily understood by those skilled in the art regarding the operation of, and the need for, such components. Furthermore, the circuital blocks shown should be understood to primarily include elements providing the named function as well as customary filtering, noise reducing, and biasing circuitry.

As a radio signal is received through an antenna 26, a duplexer 28 directs the signal to a variable attenuation stage 27 including a variable attenuator circuit 22 (discussed in greater detail below) through an RF signal input line 47. After the variable attenuation stage 27. signals are input through an amplifier input line 25 to an RF amplifier (RF AMP) circuit radio frequency (RF) receiver amplifier 30 which amplifies the received signal before supplying it to a downconverter circuit 32 which converts the amplified RF signal into an IF signal. An adjustable gain IF receiver amplifier circuit 34 receives and amplifies the IF signal before directing it to another downconverter circuit 36 which converts the received IF signal into a lower frequency IF signal. An IF receiver amplifier circuit 38 provides additional amplification before the receiver IF signal is provided to the baseband ASIC 20 through an IF input line 39. The baseband ASIC 20 also supplies a transmitter IF signal to an IF transmitter amplifier circuit 40 through an IF output line 41. After amplification, the transmitter signal is converted to a higher IF frequency through upconverter 42 and then adjustably amplified through an adjustable gain IF amplifier circuit 44. An upconverter circuit 46 then converts the IF signal into an RF signal which is then amplified by an RF amplifier 48. A directional coupler 50 passes the RF signal through to the duplexer 28 which directs the RF transmitter output signal to the antenna 26 for final output.

Through continuous adjustment of the amount of amplification provided by the adjustable gain IF receiver amplifier circuit 34, the receiver IF signal is maintained within a small range of variations for acceptable input into the baseband ASIC 20. Control of the adjustable gain IF receiver amplifier circuit 34 is accomplished by an automatic gain control (AGC) circuit 60. An AGC detector circuit 62 receives a representative IF signal through AGC input line 63. As is discussed in greater detail below, a direct current (DC) signal is output from the AGC detector circuit 62 through an AGC detector output line 64 which represents the strength of the received signal. An AGC integrator circuit 66 compares the DC signal to a relatively constant AGC reference signal received over an AGC reference line 67 from the logic circuit 23. The integrated difference between the two signals produces a received signal strength indication (RSSI) which is output onto an open loop output line 68 connected to a linear inverter 70 supplying an AGC control signal to the adjustable gain IF receiver amplifier circuit 34 over a receiver amplification control line 72. The linear inverter 70 inverts the signal received over the open loop output line 68 to create an inverse relationship between the received signal strength and the amount of amplification provided by the adjustable gain IF receiver amplifier circuit 34. Thus, for example, as received signal strength drops, the amount of amplification provided by the adjustable gain IF receiver amplifier circuit 34 increases.

The open loop output line 68 also provides an input to a negative summer circuit 80 which controls the adjustable gain IF transmitter amplifier circuit 44 through a transmitter amplification control line 82. In this way, the open loop output line 68 provides the open loop component of the total output power control so that the AGC integrator circuit 66 and AGC detector circuit 62 also contribute to open loop gain control. One of the functions of the negative summer circuit 80, that of creating an inverse relationship between received signal strength and amplification, is similar to that of the linear inverter circuit 70. Thus, for example, without regard to closed loop effects as received signal strength drops, the amount of amplification provided by the adjustable gain IF transmitter amplifier circuit 44 increases. Regarding closed loop control, the negative summer circuit 80 also receives input directly from the logic circuit 23 through a transmit gain adjust line 90. As explained below, the transmit gain adjust signal on the transmit gain adjust line 90 is an analog signal representing the closed loop gain control and attenuation correction portions of total output power control as dictated by the transmitter amplification control signal on the transmitter amplification control line 82. The present invention pertains primarily to the process of generating this transmit gain adjust signal on the transmit gain adjust line 90.

The open loop output line 68 further provides an input to a temperature compensation circuit 35. As discussed below, the RSSI temperature compensation circuit 35 adjusts the RSSI for temperature variations and outputs a temperature compensated RSSI on RSSI temp line 33. For clarification, it should be understood that FM signals are processed along separate paths (not shown) such that received FM signals are split away at a point inside the downconverter circuit 32. In still other embodiments of the present invention, the exact location of the variable attenuator circuit 22 varies, including locations after the initial RF amplifier circuit 30.

Through the RSSI temp line 33. the temperature adjusted RSSI signal is supplied to the variable attenuator circuit 22. When enabled by an attenuator enable signal on an attenuator enable line 330 and when activated as discussed below, the variable attenuator circuit 22 variably attenuates the received RF signal on an attenuation stage input line 47 from the RF signal input line 43 before the RF signal output from the duplexer 28 reaches the RF amplifier circuit 30 through amplifier input line 25. The amount of attenuation varies according to the temperature adjusted RSSI signal on the RSSI temp line 33 such that the amount of attenuation increases with increases in the input RF signal power level. In addition, in a non-linear fashion, the amount of attenuation increase for a given increase in received RF signal power level is greater at lower received RF signal power levels. Along the attenuator enable line 330, the attenuator enable signal is received from the logic circuit 23. The attenuator enable line 330 is enabled, according to this disclosed implementation of the first preferred embodiment of the present invention, as long as the mobile station is operating in the CDMA mode. Thus, this attenuator enable signal on the attenuator enable line 330 is, according to this first preferred embodiment, independent of the power level of the received RF signal, as well as other factors, such as the frame error rate (FER). In addition, as is discussed in greater detail below, the variable attenuator circuit 22 is configured to be activated and begin attenuating the RF signal from the RF signal input line 43 when the RF signal reaches an activation power level. Likewise as the RF signal power level falls below the same activation power level, the variable attenuator circuit 22 is deactivated and attenuation substantially ceases.

The transmit gain adjust signal on the transmit gain adjust line 90 is generated by the logic circuit 23 in response to processes internal to the logic circuit 23 as well as input received from the baseband ASIC 20, an IM-adjusted RSSI A/D circuit 31, and an output comparator circuit 92. The IM-adjusted RSSI A/D circuit 31 converts analog signals representative of the attenuation levels of the received RF signals into digital form. These digital signals are input to the logic circuit 23 through IM adjust line 91. The output comparator circuit 92 receives input from an output detector circuit 94 which receives input from the directional coupler 50. In general terms, the output detector circuit 94 generates a DC signal representative of the total output power of the radio telephone. This DC signal is compared inside the output comparator circuit 92 to a constant comparator threshold voltage on line 95 generated by the logic circuit 23 as a representation of an output power trigger level. The result of the continuous comparison is output on line 97 from the output comparator circuit 92 to the logic circuit 23.

Figure 2:
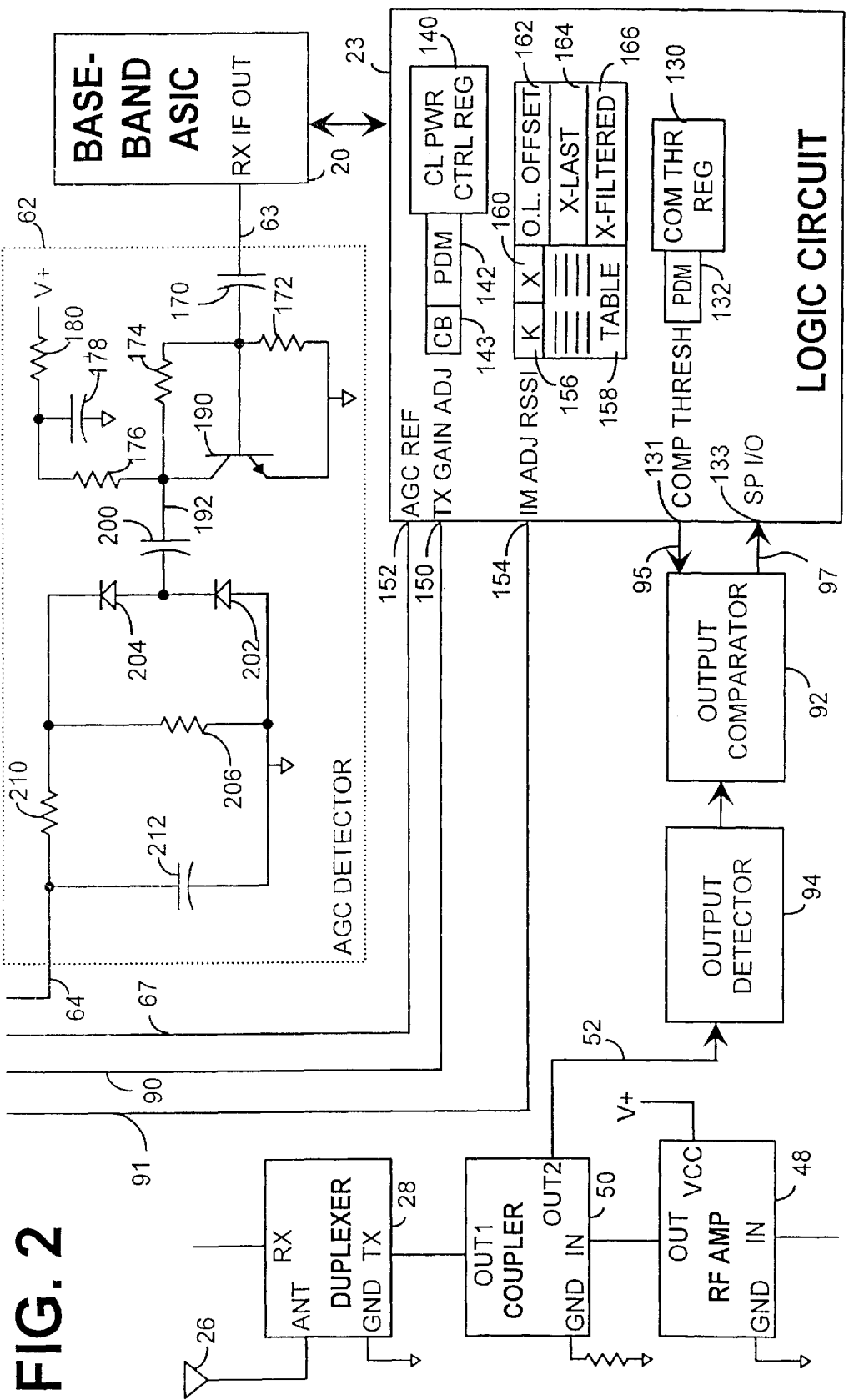
FIG. 2 is a schematic view of selected elements shown in FIG. 1.
Figure 3:
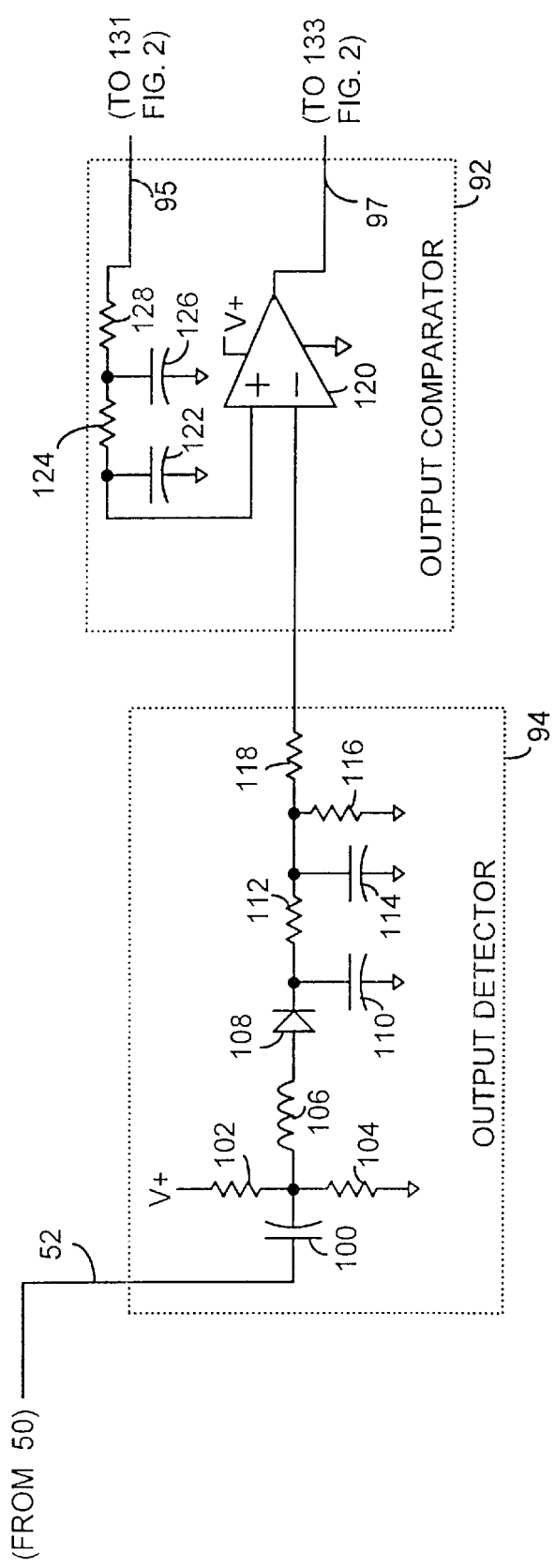
FIGS. 3–6 are schematic views of selected additional elements shown in FIG. 1.

Referring now to FIGS. 2 and 3 for a schematic view of selected elements of FIG. 1. The directional coupler 50 directs a small representative portion of the output signal from the RF amplifier 48 through a pin labeled OUT2. The signal flowing from the OUT2 pin is received by the output detector 94 which generates a DC signal representative of the total output power of the radio telephone. An AC-coupling capacitor 100 (FIG. 3) removes any DC component from the signal output from the directional coupler 50. After filtering and conditioning by biasing resistors 102 and 104 and inductor 106, a diode 108 functions as a half-wave rectifier to convert the remaining AC signal into a half-wave rectified signal. The output from diode 108 is smoothed and prepared for input to the output comparator circuit 92 by capacitors 110 and 114 and resistors 112, 116, and 118.

The output comparator circuit 92 receives the DC signal representative of the total output power from the output detector circuit 94. The DC signal is continuously compared through an operational amplifier 120 to a constant signal set by the logic circuit 23. The constant signal is output through a comparator threshold (COMP THRESH) output 131 of the logic circuit 23 before being filtered and conditioned for input into the non-inverting input of the operational amplifier 120. The COMP THRESH signal is a pulse density modulated representation of a comparator threshold register 130 located within the logic circuit 23 and generated by a similarly located pulse density modulator (PDM) 132. PDM 132 essentially provides a digital-to-analog conversion of the constant value represented in the comparator threshold register 130, a digital memory element.

Since output from the output detector circuit 94 is directed into the inverting input of the operational amplifier 120, the operational amplifier outputs a high signal into an input/output (I/O) port 133 of the logic circuit 23 as long as the output from the output detector circuit 94 is lower than the filtered and conditioned constant output from the COMP THRESH output of the logic circuit 23. This condition corresponds to the total output power of the radio telephone being below the output power trigger level. However, when the total output power of the radio telephone rises above the output power trigger level, the condition is indicated by a transition from high to low at the output of the output comparator circuit 92. The output remains low until the output from the output detector circuit 94 once again falls below the filtered & conditioned COMP THRESH level, an event signifying that the total output power of the radio telephone has fallen below the output power trigger level.

Through methods which are discussed in greater detail below, the logic circuit 23 utilizes the signal levels detected from the output comparator 92 to modify a closed loop power control register (CL PWR CTRL REG) 140 located within the logic circuit 23. Like the comparator threshold register 130 and PDM 132, a PDM 142 provides an analog representation of values stored in the closed loop power control register 140. This analog representation is output through a transmit gain adjust (TX GAIN ADJ) output 150 of the logic circuit 23 onto the transmit gain adjust line 90 which is connected to the negative summer 80 shown in FIG. 1. An AGC reference output 152 is also shown supplying the AGC reference signal onto the AGC reference line 67. The logic circuit 23 also includes a control bit (CB) 143 located in another area of logic circuit 23 memory which is writeable by the logic circuit 23 and which controls whether the logic circuit 23 controls the closed loop power control register 140 or the logic circuit 23 controls the closed loop power control register 140 through conventional closed loop power control techniques.

The baseband ASIC 20 is shown supplying a representative receiver IF signal onto the AGC input line 63 through a receiver IF output (RX IF OUT) to the AGC detector 62. The representative receiver IF signal is examined by the AGC detector 62 to yield on the AGC detector output line 64 a DC representation of the received signal strength. A capacitor 170 blocks any DC component of the signal on the AGC input line 63. Biasing elements 172, 174, 176, 178, and 180 are sized to bias a bipolar transistor 190 in the active amplification region so that a constant amount of gain is applied between the base and the collector of the bipolar transistor 190 which is connected to the amplified line 192. The amplified line 192 is connected to a capacitor 200 which is further connected to the cathode of a diode 202 with a grounded anode and to the anode of diode 204. The cathode of the diode 204 is connected to a grounded resistor 206 and a resistor 210 which is connected to the AGC detector output line 64 along with a grounded capacitor 212. Since capacitor 200 is connected in series (AC-coupled) with subsequent elements. capacitor 200 removes the DC component from the AGC input signal and cooperates with the diodes 202, 204 to add a new DC level to the AC component which is linearly proportional to the incoming AC signal level. As the AC signal level rises, the capacitor 200 is charged, and when the AC signal level falls, the diode 202 turns on, resulting in an upward voltage shift. Resistor 210 and capacitor 212 function as a low pass filter to remove the remaining AC component to leave a DC signal which is linearly proportional to the AC signal level of the AGC input signal. In addition, the resistor 210 functions as an averaging means to slow the charge of capacitor 212 so that the AGC output signal on the AGC detector output line 64 is an averaged linear output. Furthermore, the resistors 206 and 210 are preferably approximately equal in value.

Figure 4:
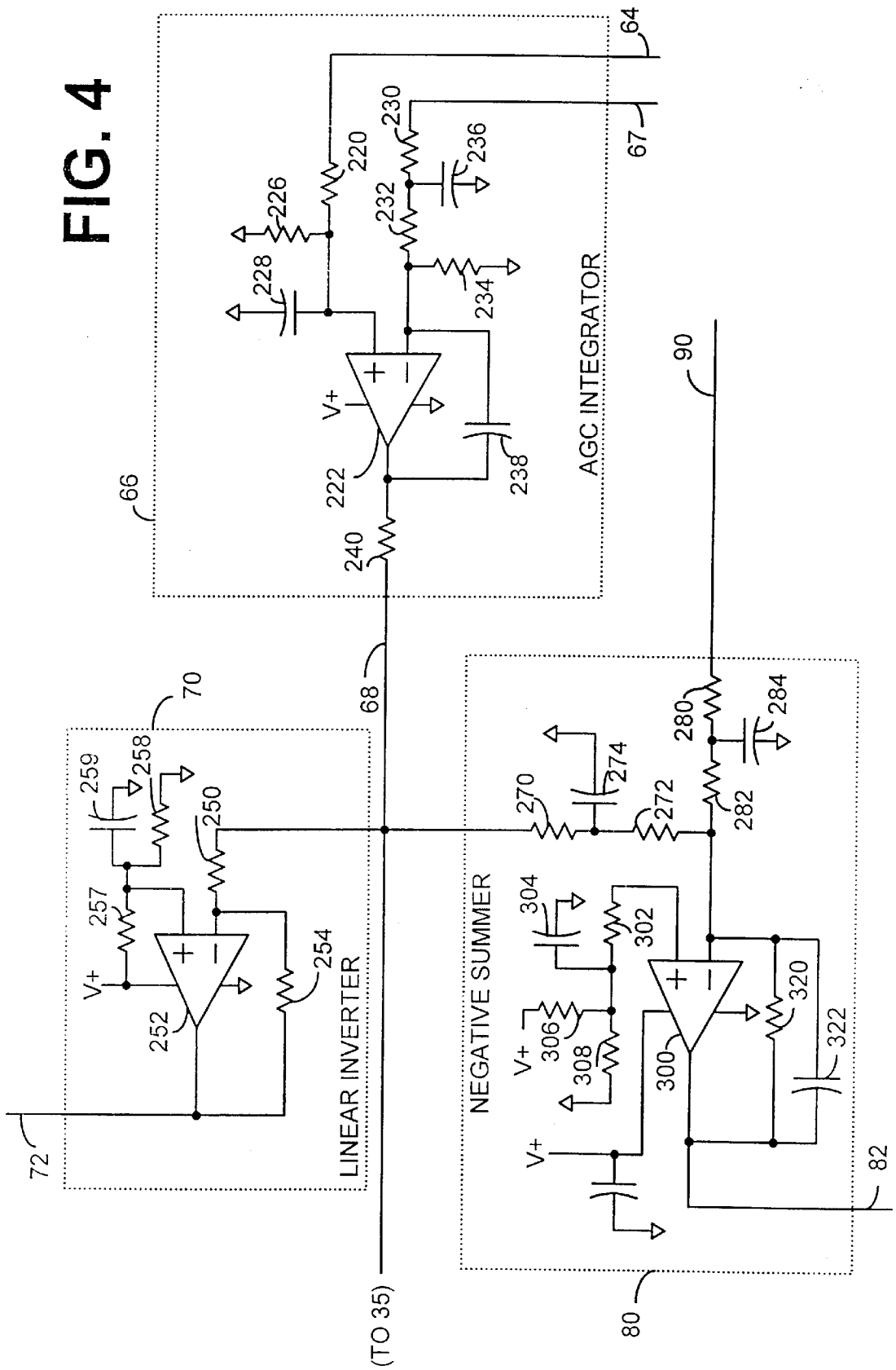

Refer now to FIG. 4 for a schematic view of the AGC integrator circuit 66, the linear inverter 70, and the negative summer 80. The AGC detector output line 64 is shown supplying signals through a biasing resistor 220 to the non-inverting input of an operational amplifier 222, which input is also connected to biasing components 220, 226, and 228. The AGC REF line 67 is shown providing the relatively constant AGC reference signal through a network of biasing elements 230, 232, 234, and 236 to the inverting input of the operational amplifier 222. The output and inverting input of the operational amplifier 222 are shown connected through a capacitor 238 so that the operational amplifier 222 functions as an open loop integrator to produce an gain control signal on the open loop output line 68 equal to the difference between the signal levels on the AGC detector output line 64 and the AGC REF line 67. The linear inverter 70 is shown receiving the gain control signal on the open loop output line 68 and providing output through the receiver amplification control line 72. The open loop output line 68 is shown connected through a resistor 250 to the inverting input of an operational amplifier 2. A resistor 254 is shown connected between the output and inverting input of the operational amplifier 252, whereas the non-inverting input of the op amp 252 is grounded through a network of biasing elements 257, 258, and 259. Thus, the operational amplifier 252 functions as an inverting amplifier operating in a linear manner without undue complexity.

The negative summer 80 is shown receiving open and closed loop signals through the open loop output line 68 and the transmit gain adjust line 90, respectively. After passing through biasing/filter networks composed of resistors 270, 272, 274, 280, 282, and 284, signals are combined from the open loop output line 68 and the transmit gain adjust line 90 at the inverting input of an operational amplifier 300. The biasing filter networks (270–284) exhibit time constant delays appropriate for ensuring stable operation. According to the first preferred embodiment of the present invention, the delays introduced are approximately 30 ms on the open loop output line 68 and 0.5 ms on the transmit gain adjust line 90. The operational amplifier 300 is biased, through elements 302, 304, 306, 308, 320, and 322 to amplify and invert the sum of the two input signals and provide output on the transmitter amplification control line 82. Thus, it is through the operational amplifier 300 that both closed loop gain control and open loop gain control components are combined to control total output power of the radio telephone.

Figure 5:
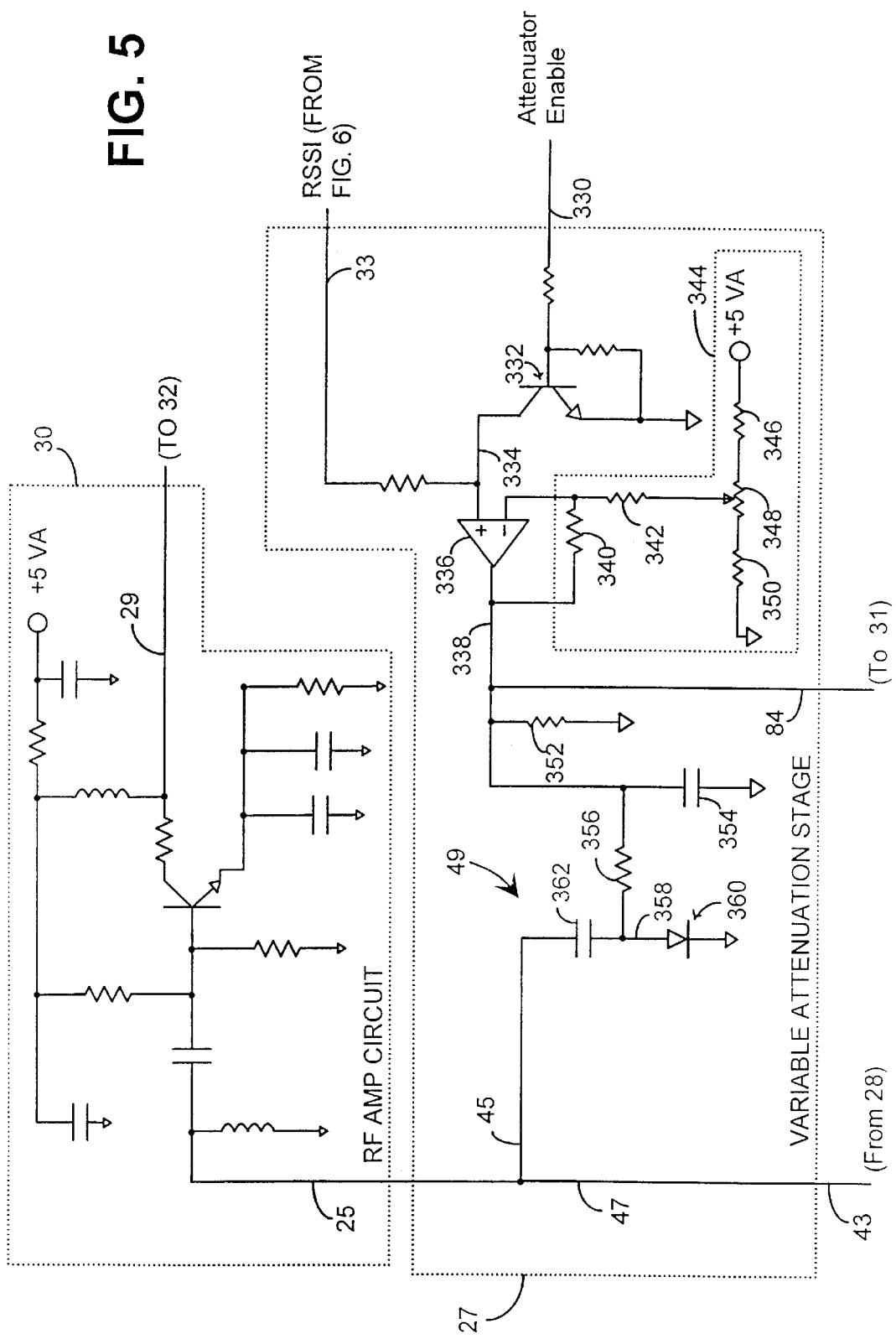
Figure 6:
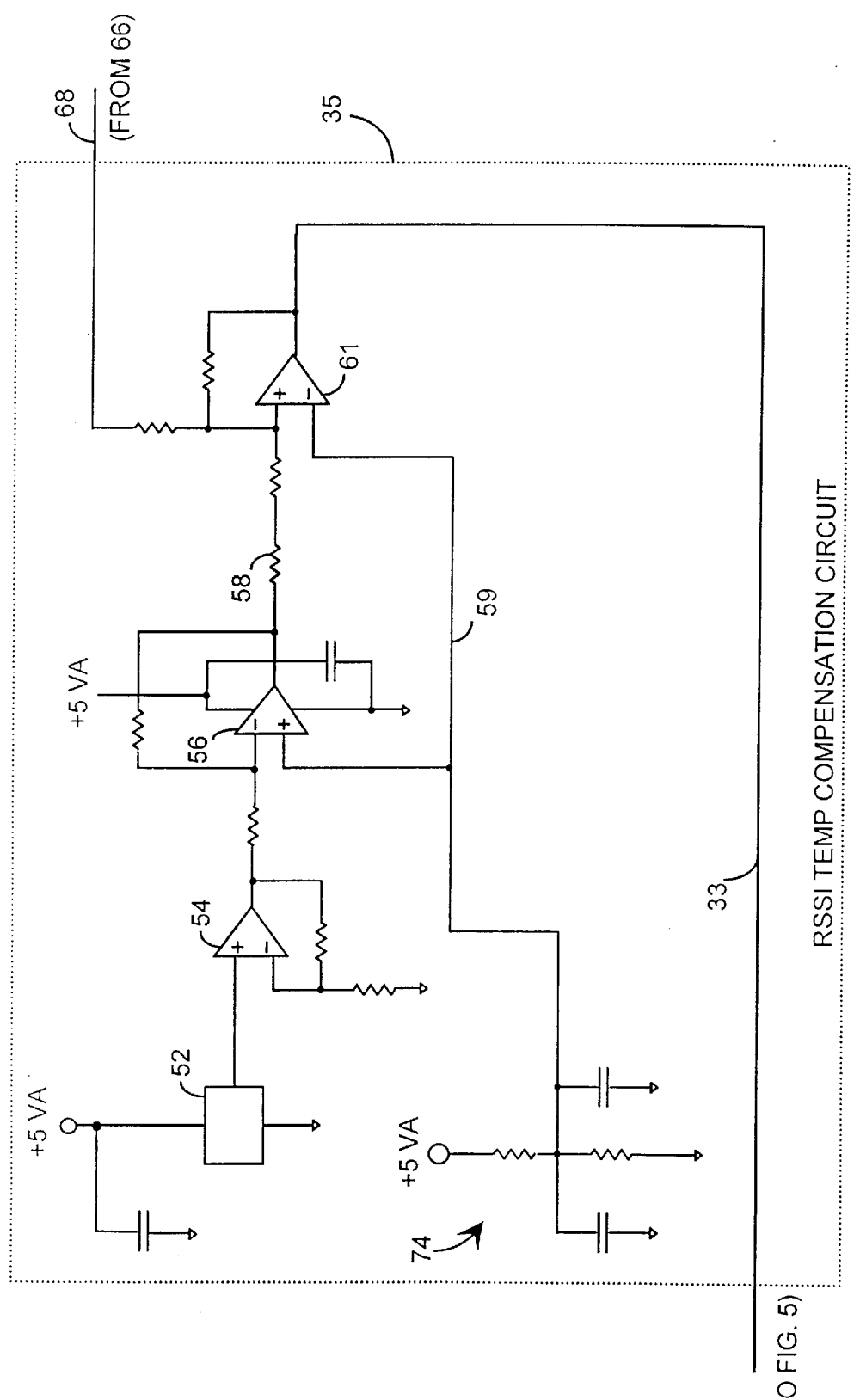

FIGS. 5 and 6 are schematic representations of the RF amplifier circuit 30, the variable attenuation stage 27 and the RSSI temperature compensation circuit 35, respectively, of FIG. 1. Again, with reference to FIG. 1. according to the preferred embodiments of the present invention, RF signals from the RF signal input line 43 are attenuated by the variable attenuator circuit 22 (FIG. 1) according to the temperature compensated RSSI signal on the RSSI temp line 33 after the variable attenuator circuit 22 is enabled through the attenuator enable signal on the attenuator enable line 330 and activated as described above. The attenuator enable line 99 is connected to a switching arrangement including a transistor switch 332 to effectively ground the RSSI temp line 33 through line 334 and disable the variable attenuator circuit 22 (FIG. 1) when the attenuator enable line 330 is not enabled, i.e., during communication in FM mode. In the disclosed implementation of the preferred embodiment of the present invention, when the attenuator enable line 330 is enabled, the temperature compensated RSSI on the RSSI temp line 33 is supplied to an operational amplifier (threshold op amp 336) where it is compared to an activation threshold level determined by a threshold/gain circuit 344, including resistors 340, 342, 346, 350, and variable resistor 348 arranged as shown in FIG. 5. Other circuitry arrangements that function similar to threshold/gain circuit 344 would provide acceptable substitutes for threshold/gain circuit 344 as would be understood by persons skilled in the art. The threshold/gain circuit 344 controls the voltage supplied to the negative input of the threshold op amp 336, and thus to the rest of the variable attenuator circuit 22 (FIG. 1). As a result, the voltage supplied to the negative input of the threshold op amp 336 via the threshold/gain circuit 344 determines the activation threshold level at which the variable attenuator circuit 22 (FIG. 1) is activated and begins to attenuate the RF signals on the amplifier input line 25, as discussed in more detail below. In addition to resistors 342 and 340 which are primarily responsible for setting the gain of the op amp 336, the threshold/gain circuit 344 includes a voltage divider to set the activation threshold level which, according to one implementation of the preferred embodiment, includes resistors 350, 346, and variable resistor 348 connected between a voltage source and ground as shown. In another implementation of this preferred embodiment, only fixed resistors 346 and 350 are connected between the voltage source and ground.

The temperature compensated RSSI signal feeds from RSSI temp line 33 into the positive input of threshold op amp 336. While the temperature compensated RSSI signal level is above an activation threshold determined by the threshold/gain circuit 344, the output signal on line 338 from the threshold op amp 336 fluctuates according to the temperature compensated RSSI signal as an amplified comparison between the temperature compensated RSSI signal and the activation threshold. The signal on line 338 flows through a supply resistor 356 which is connected to an attenuating branch 49. A resistor 356 is connected as shown to line 338 to drain off residual current in line 338 when the variable attenuator circuit 22 (FIG. 1) is not attenuating, and a filtering capacitor 354 is connected as shown to line 338 to ground unwanted AC signals. The attenuating branch 49 includes an attenuation line 45 connected in a shunt arrangement (as shown) to the attenuation stage input line 47, as well as a PIN diode 360 and an AC coupling capacitor 362. The PIN diode 360 functions as a variable impedance for current flowing from the attenuation stage input line 47, and the amount of impedance is determined by the current supplied through resistor 356. The AC-coupling capacitor 362 is connected between the PIN diode 360 and the attenuation stage input line 47 to provide DC isolation between the PIN diode 360 and the RF amplifier circuit 30, and the value of the AC-coupling capacitor 362 is selected to resonate with any stray inductance in the circuit to maximize available attenuation by the PIN diode 360. Thus, according to the current supplied to the PIN diode 360 through the resistor 356, the PIN diode 360 and the capacitor 362 provide the RF signal input line 43 a variable impedance path to ground through the attenuation stage input line 47 and the attenuating line 45. As depicted in FIG. 5, the PIN diode 360 is connected to the attenuation stage input line 47 in a shunt arrangement which contributes to the non-linear changes in attenuation per unit change in received RF signal strength, as discussed below. However. because of the high intercept point of the PIN diode 360, it does not contribute significantly to the to IM product generation. Furthermore, for every 1 dB of attenuation by the PIN diode 360, the desired signal-to-IM product ratio will increase by 2 dB.

While the attenuator enable signal is enabled (e.g., while in CDMA mode for the first preferred embodiment), as long as the temperature compensated RSSI on the RSSI temp line 33 effectively indicates an RF signal input power level on the RF signal input line 43 which is above the activation threshold level (activation power level). the variable attenuator circuit 22 (FIG. 1) is activated and utilizes the attenuation branch 49 with the PIN diode 360 to variably attenuate RF signals on the RF signal input line 43 to produce attenuated RF signals on the amplifier input line 25 in accordance with the temperature compensated RSSI signal levels. In accordance with the first preferred embodiment, the variable attenuator circuit 22 (FIG. 1) must be enabled as described above in order to be activated. When the temperature compensated RSSI indicates a received RF signal power level below the activation threshold level amount, the variable attenuator circuit 22 (FIG. 1) is deactivated and there is very little attenuation of RF signals in the RF signal input line 43. In one implementation, this activation power level (as determined in large part by the inventive arrangement of the present invention and the values of the resistors 346, 348, 350 it the threshold/gain circuit 344) is approximately −95 dBm. However, depending on implementation and communication environment specifics, this activation power level may vary between −100 dBm and −85 dBm. Generally, the activation power level will vary according to the requirements specific to the RF receiver system being used with the present invention as would be understood by persons reasonably skilled in the art. The amplifier input line 25 provides attenuated RF signals which are amplified and output along line 29 by the RF amplifier circuit 30, which would be understood by one reasonably skilled in the art.

Referring now to FIG. 6, as stated above, the RSSI temperature compensation circuit 35 adjusts the RSSI on the RSSI line 38 for temperature variations to help maintain consistent operation of the mobile station. A temperature dependent voltage (temp signal) generated by a temperature sensor integrated circuit (IC) 52 is fed into the positive input of operational amplifier (op amp) 54 which adds an appropriate amount of gain thereto. In accordance with the preferred embodiment of the present invention, one example of an acceptable temperature signal supply 52 is a thermistor plus operational amplifier package manufactured by National Semiconductor Corp. of Santa Clara, Calif. The temp signal is next added to a reference signal (Vref) on a Vref line 59 by an op amp adder 56 to produce a referenced signal at the output of op amp adder 56. Vref is provided by a voltage divider circuit 74 and is the bias voltage at the positive input of op amp adder 56. The gain adjusted temp signal from op amp 54 is provided to the negative input of op amp adder 56. The referenced signal is next combined with the RSSI signal from RSSI line 61 and together fed into the positive input of an op amp 61. The combined referenced signal plus RSSI signal is added to Vref in op amp 61. Vref is also the biasing voltage at the negative input of op amp 61. Thus, the output of op amp 68 is a temperature compensated RSSI signal. In other embodiments of the present invention where temperature compensation is not desired or necessary, the RSSI temperature compensation circuit 35 is omitted.

FIG. 7 is a flow chart representation of a power control process for the elements shown in FIG. 1, in accordance with one preferred embodiment of the present invention. Referring primarily to FIG. 7 with additional reference to FIGS. 1 and 2, after the process starts in step 400, the SP I/O port 133 is configured to be a general purpose SP I/O port which is readable by the logic circuit 23 in step 402, unless already configured as such. Subsequently, according to step 404, conventional closed loop control of the closed loop power control register 140 by the logic circuit 23 is initiated by the logic circuit 23. According to this first preferred embodiment of the present invention, the process of step 404 includes initializing the control bit 143 in the state allowing normal logic circuit 23 control of the closed loop power control register. Subsequently, the SP I/O port 133 is read by the logic circuit 23 in step 406. If the SP I/O port 133 is found to be receiving a high signal (e.g., +5 volts), the NO branch of decision block 408 directs operation to step 409 where a function call is made to adjust the closed loop power control register 140 one step up or down according to attenuation information from the variable attenuator circuit 22 (FIG. 1). With reference to this function in FIG. 9. a TX GAIN DELTA is determined as the difference between the attenuation correction and the open loop offset in step 482. If the TX GAIN DELTA is zero, the process ends, otherwise, as shown with decision 486, the CL PWR CTRL register and open loop offset are incremented or decremented depending on whether the TX GAIN DELTA is positive or negative, respectively. The process of FIG. 7 next moves to step 410 where conventional closed loop control of the closed loop power control register 140 is maintained (i.e., the control bit 143 is left unchanged). Then, a delay step 412 indicates that the process of FIG. 7 delays for a predetermined amount of time before operation repeats back to step 406. According to this first preferred embodiment of the present invention, this delay corresponds to the period of time between receiving closed loop power control information from the base station, such as 1.25 ms. In this manner, a first mode of operation is maintained while the SP I/O port 133 is high, indicating that the total output power of the radio telephone is below the output power trigger level. Another reason for the delay in the present invention is to allow changes in power control to take effect prior to reading the SP I/O port 133 again.

On the other hand, when the total output power of the radio telephone exceeds the output power trigger level, the output comparator 92 outputs a low signal onto the SP I/O port 133. Through the YES branch of decision block 408, operation proceeds to step 414 as a second mode begins to prevent power control saturation and limit maximum output power of the radio telephone. At step 414, the logic circuit 23 modifies the control bit 143 to enable saturation prevention control of the closed loop power control register 140, thus disabling conventional closed loop power control of that register. Subsequently, the logic circuit 23 automatically modifies the closed loop power control register 140 to decrement the total output power of the radio telephone by one step. In this preferred embodiment of the present invention, this process includes incrementing the value stored in the closed loop power control register 140 by one step, corresponding to a 1 dB reduction in total output power. In one implementation of the first preferred embodiment of the present invention, the closed loop power control register includes the seven most significant bits of an eight-bit register, thus providing 128 total steps of control (64 bits above the open loop estimate and 64 bits below the open loop estimate). This increased range of closed loop control provides additional ability to accommodate production variances, etc.

After step 416, the delay step 412 indicates another delay before operation again continues with step 406 so that the I/O port 133 is continually read by the logic circuit 23. The saturation prevention mode continues through repeated loops through the YES branch of decision block 408 so that the closed loop power control register 140 is continually incremented (decrementing total output power) until the total output power falls below the output power trigger level. When this happens, the NO branch of decision block 408 directs operation back to steps 409 and 410 where operation according to attenuation correction and conventional closed loop control resumes. In many circumstances, only one loop through the YES branch of decision block 408 is necessary before alternating back to the NO branch. However, since the open loop gain control system contribution to the total output power may also rise, consecutive loops through the YES branch of decision block 408 are also encountered where the total output power is continually decremented until it falls below the output power trigger level.

FIG. 8 is a flow chart representation of the function called by step 407 of the power control process of FIG. 7. Once step 407 of FIG. 7 is reached the process proceeds to step 502 which starts the process for updating the attenuation correction value. Next, in step 504, the IM adjust RSSI value at input 154 is read to variable (K) and stored in register 156. The variable (K) is a digital sample output from the IM-adjusted RSSI A/D 31 representing the amount of attenuation provided by the variable attenuator circuit 22. In this preferred embodiment of the present invention, the variable (K) is one of 255 possible voltage levels output by the A/D 31. Then, in step 506, the TX gain correction value is determined by comparing the value stored in register 156 represented by variable (K) against a table of predefined decibel values (table 158) ranging from zero to twenty decibels and stored in register 160 as variable (X). The TX gain correction value (X) is then filtered according to the TX gain correction history value (X-last) stored in register 164 to compute a filtered TX gain correction value (X-filtered) which is stored to register 166. X-filtered is computed according to a single pole discrete time infinite impulse response (IIR) filter which would be understood by persons reasonable skilled in the art. As a further part of step 506. the unfiltered TX gain correction value (X) is mathematically scaled for better resolution and finally rounded to a whole number decibel unit within the zero to twenty decibel range so that X-filtered is a whole number decibel value. The current value of X-filtered in then saved as X-last in step 510 and returned as the updated target gain offset value (step 407 of FIG. 7) in step 512.

Finally, in light of the variances in open loop power, it should be understood that the term "maximum power" and similar terms used herein refer to one of a small range of total output power levels above the output power trigger level. Similarly, the scope of the present invention includes additional preferred embodiments which include multiple output power trigger levels based upon various communication modes. For example, in certain communication modes, the conventional closed loop power control step may be larger than 1.0 dB. thus the threshold amount would need to be lower to appropriately limit output power for that mode of communication.

While the embodiments of the present invention which have been disclosed herein are the preferred forms, other embodiments of the present invention will suggest themselves to persons skilled in the art in view of this disclosure. Therefore, it will be understood that variations and modifications can be effected within the spirit and scope of the invention and that the scope of the present invention should only be limited by the claims below. Furthermore, the equivalents of all means- or step-plus-function elements in the claims below are intended to include any structure, material, or acts for performing the function as specifically claimed and as would be understood by persons skilled in the art of this disclosure.

We claim:

1. A method of controlling output power of a radio telephone communicating with a base station, said method comprising steps of:
   attenuating received RF signals on an RF signal receiver line of the radio telephone to reduce intermodulation (IM) distortion including a step of coupling a variable attenuator circuit to the RF signal receiver line; and
   determining the output power according to received RF signal attenuation information and closed loop power control information received from the base station, including steps of determining an open loop output power correction value corresponding to the attenuation levels of the received RF signals, and adjusting the output power according to the open loop output power correction value to compensate for attenuation of received RF signals.

2. The method of claim 1, wherein the determining step includes a step of adjusting an open loop power control signal according to the received RF signal attenuation information and the closed loop power control information received from the base station.

3. The method of claim 2, wherein the adjusting step includes a step of adjusting a closed loop power control signal according the received RF signal attenuation information and the closed loop power control information.

4. A method of controlling output power of a radio telephone communicating with a base station, said method comprising steps of:
   attenuating received RF signals on an RF signal receiver line of the radio telephone to reduce intermodulation (IM) distortion including a step of coupling a variable attenuator circuit to the RF signal receiver line; and
   determining the output power according to received RF signal attenuation information and closed loop power control information received from the base station, including a step of adjusting an open loop power control signal according to the received RF signal attenuation information and the closed loop power control information received from the base station, wherein the adjusting step includes a step of adjusting a closed loop power control signal according to the received RF signal attenuation information and the closed loop power control information, wherein the step of adjusting the closed loop power control signal includes a step of combining the received RF signal attenuation information and the closed loop power control information.

5. A method of controlling output power of a radio telephone communicating with a base station, said method comprising steps of:
   attenuating received RF signals on an RF signal receiver line of the radio telephone to reduce intermodulation (IM) distortion including a step of coupling a variable attenuator circuit to the RF signal receiver line; and
   determining the output power according to received RF signal attenuation information and closed loop power control information received from the base station, including a step of adjusting an open loop power control signal according to the received RF signal attenuation information and the closed loop power control information received from the base station, wherein the adjusting step includes a step of adjusting a closed loop power control signal according the received RF signal attenuation information and the closed loop power control information, wherein the step of adjusting the open loop power control signal further includes a step of adding the adjusted closed loop power control signal to the open loop power control signal.

6. A method of controlling output power of a radio telephone communicating with a base station, said method comprising steps of:
   attenuating received RF signals on an RF signal receiver line of the radio telephone to reduce intermodulation (IM) distortion including a step of coupling a variable attenuator circuit to the RF signal receiver line; and
   determining the output power according to received RF signal attenuation information and closed loop power control information received from the base station, including a step of adjusting an open loop power control signal according to the received RF signal attenuation information and the closed loop power control information received from the base station, wherein the step of adjusting an open loop power control signal includes steps of determining an open loop output power correction value corresponding to the attenuation levels of the received RF signals, and adjusting the open loop power control signal according to the open loop output power correction value to compensate for attenuation of received RF signals.

7. The method of claim 6, wherein the step of adjusting the open loop power control signal according to the open loop output power correction value includes a step of adjusting a closed loop power control signal to compensate for the attenuation of the received RF signals.

8. The method of claim 6, wherein the step of determining an open loop output power correction value includes a step of determining relationships between the received RF signal strengths and an attenuation activation threshold level.

9. The method of claim 8, wherein the step of determining relationships between the received RF signal strength and an attenuation activation threshold level includes a step of comparing relationships between a received RF signal strength indication (RSSI) and the attenuation activation threshold level through an operational amplifier configured to provide a comparison output representative of the level of attenuation of the received RF signal.

10. The method of claim 9, wherein the step of continually determining an open loop output power correction value further includes steps of
    generating and storing an integer value based on the comparison output, and
    determining from the integer value the open loop output power correction value by comparing the integer value to a table of predefined open loop output power correction values.

11. The method of claim 6, wherein the step of determining an open loop output power correction value further includes steps of
    generating and storing an integer value based on the received RF signal attenuation information, and
    determining from the integer value the open loop output power correction value.

12. The method of claim 7, wherein the step of adjusting the closed loop power control signal includes a step of adjusting the closed loop power control signal by approximately one decibel every 1.25 milliseconds.

13. The method of claim 7, wherein the step of adjusting the closed loop power control signal includes a step of adjusting a digital memory element in response to the open loop output power correction value.

14. The method of claim 7, wherein the step of adjusting the closed loop power control signal further includes steps of
    defining a filtered output power correction change to be a filtered change in output power required to compensate for attenuation of the received RF signals,
    generating and supplying the filtered output power correction change, and
    continually adjusting a digital memory element in response to a non-zero filtered output power correction change to continually adjust the closed loop power control signal.

15. The method of claim 14, wherein the step of generating and supplying the filtered output power correction change includes a step of generating and supplying the filtered output power correction change by comparing a filtered open loop output power correction value to an open loop output power counter value.

16. The method of claim 14, wherein the step of adjusting the closed loop power control signal further includes a step of continually adjusting a digital memory element in response to the filtered output power correction change to continually adjust the closed loop power control signal by one decibel every 1.25 milliseconds.

17. The method of claim 15, wherein the step of adjusting the closed loop power control signal further includes steps of responsive to determining that the filtered output power correction change is positive wherein the filtered open loop output power correction value is greater than the open loop output power counter value, adjusting the digital memory element to decrement the closed loop control system portion of the output power by approximately one decibel, and incrementing the open loop output power counter value by one;

responsive to determining that the filtered output power correction change is negative wherein the filtered open loop output power correction value is less than the open loop output power counter value, adjusting the digital memory element to increment the closed loop control system portion of the output power by approximately one decibel, and decrementing the open loop output power counter value by one; and repeating the above continually adjusting a digital memory element step every 1.25 milliseconds while the filtered output power correction change is non-zero.

* * * * *